United States Patent
Kim et al.

(10) Patent No.: US 7,164,316 B2
(45) Date of Patent: Jan. 16, 2007

(54) SERIES-TYPE DOHERTY AMPLIFIER WITHOUT HYBRID COUPLER

(76) Inventors: Junghyun Kim, Woo-wul villa 403 ho, 178-76, Bongchon 11 dong, Kwanak-gu, Seoul (KR); Joo-Min Jung, 1585-2 Bongcheon 4-dong, Kwanak-gu, Seoul, 151-054 (KR)

( * ) Notice: Subject to any disclaimer, the term of this patent is extended or adjusted under 35 U.S.C. 154(b) by 1 day.

(21) Appl. No.: 10/905,661

(22) Filed: Jan. 14, 2005

(65) Prior Publication Data

US 2006/0109053 A1   May 25, 2006

(51) Int. Cl.
*H03F 1/00* (2006.01)
*H03F 3/04* (2006.01)

(52) U.S. Cl. .......................... 330/151; 330/310
(58) Field of Classification Search .............. None
See application file for complete search history.

(56) References Cited

U.S. PATENT DOCUMENTS

| | | | |
|---|---|---|---|
| 6,133,788 A * | 10/2000 | Dent | 330/124 R |
| 6,369,651 B1 * | 4/2002 | Dent | 330/127 |
| 6,469,581 B1 * | 10/2002 | Kobayashi | 330/295 |
| 6,472,934 B1 * | 10/2002 | Pehlke | 330/10 |
| 6,791,417 B1 * | 9/2004 | Pengelly et al. | 330/295 |
| 6,853,245 B1 * | 2/2005 | Kim et al. | 330/124 R |
| 6,922,102 B1 * | 7/2005 | Myer et al. | 330/51 |
| 7,042,283 B1 * | 5/2006 | Suzuki et al. | 330/52 |
| 7,053,706 B1 * | 5/2006 | Kwon et al. | 330/124 R |
| 7,061,314 B1 * | 6/2006 | Kwon et al. | 330/124 R |
| 7,064,606 B1 * | 6/2006 | Louis | 330/124 R |

\* cited by examiner

*Primary Examiner*—Robert Pascal
*Assistant Examiner*—K. Flanagan
(74) *Attorney, Agent, or Firm*—Townsend and Townsend and Crew LLP

(57) ABSTRACT

Provided is a series type Doherty amplifier which includes a first power amplifier and a second power amplifier using a plurality of transformers. The first power amplifier and the second power amplifier are connected in series. The second power amplifier and a first transformer are connected in series. A first path is branched from a junction between the first power amplifier and the second power amplifier and a phase delay device and a second transformer are connected in series. An output port of the second transformer is connected to a junction of a second path of an output port of the second power amplifier. An efficiency of each power amplifier is determined by a ratio of 1:M in size of a final stage of each of the first and second power amplifiers.

31 Claims, 5 Drawing Sheets

US 7,164,316 B2

SERIES-TYPE DOHERTY AMPLIFIER WITHOUT HYBRID COUPLER

This application claims priority under 35 U.S.C. § 119 to Korean patent application number 10-2004-0097460, filed Nov. 25, 2004, which is incorporated by reference along with all other references cited in this application.

BACKGROUND OF THE INVENTION

1. Field of the Invention

The present invention relates to a Doherty amplifier, and more particularly, to an apparatus for compensating for the phase of a Doherty amplifier.

2. Description of the Related Art

A Doherty amplifier is one of amplifiers used in a high efficiency modulation method for a high power transmitter and mainly improves efficiency by a combination of a B-class amplifier, a C-class amplifier, and an impedance inverting circuit.

FIG. 1 is a block diagram of a conventional Doherty amplifier. Referring to FIG. 1, the conventional Doherty amplifier includes a 3 dB hybrid coupler 110, a carrier amplifier 120, a peak amplifier 130, and a quarter wave transformer 140 having a second transformer 142 and a first transformer 141 coupled with output port 150 as shown.

The Doherty amplifier adopts a method of connecting the carrier amplifier 120, and the peak amplifier 130 in parallel using the quarter wave transformer 140 (λ/4 lines). The amount of current output from the peak amplifier 130 as a load varies according to a power level. Accordingly, efficiency is improved by adjusting a load impedance of the carrier amplifier 120.

In the 3 dB hybrid coupler 110, a splitter splits a signal into two signals so that one signal is input to the carrier amplifier 120 and the other signal is input to the peak amplifier 130. The signal input to the peak amplifier 130 is delayed by 90° so that a delay time difference with the signal input to the carrier amplifier 120 is compensated for.

Although the 90° phase compensation is theoretically possible, in an actual circuit, since the delayed time is not exactly 90° due to various constituent components existing in the circuit, a phase equivalent to the actual difference is to be compensated. The 3 dB hybrid coupler 110 is mainly embodied using passive devices.

The carrier amplifier 120 and the peak amplifier 130 are formed in two stages or three stages and include input matching, a drive port transistor, inter-stage matching, an output port transistor, and an output matching network.

However, the 3 dB hybrid coupler 110 formed of the passive devices requires the passive devices having large sizes to be embodied at a lower frequency so that miniaturization thereof is difficult.

SUMMARY OF THE INVENTION

To solve the above and/or other problems, the present invention provides a Doherty amplifier which can be simply embodied by connecting a plurality of power amplifiers in series without a hybrid coupler to optimize design and adding a path in a general amplifier structure.

According to an aspect of the present invention, a series type Doherty amplifier comprises a first power amplifier and a second power amplifier using a plurality of transformers, wherein the first power amplifier and the second power amplifier are connected in series, the second power amplifier and a first transformer are connected in series, a first path is branched from a junction between the first power amplifier and the second power amplifier and a phase delay device and a second transformer are connected in series, an output port of the second transformer is connected to a junction of a second path of an output port of the second power amplifier, and an efficiency of each power amplifier is determined by a ratio of 1:M in size of a final stage of each of the first and second power amplifiers.

The series type Doherty amplifier further comprises a control portion applying an external bias to each of the first and second power amplifiers according to an output power level.

According to another aspect of the present invention, a series type Doherty amplifier comprises N units of power amplifiers which are connected in series using a plurality of transformers, wherein a first power amplifier and a second power amplifier are connected in series, an output port of the second power amplifier is connected to a (2(N−1)−1)th transformer in series, an output port of an (N−1)th power amplifier is connected to a third transformer in series, an output port of a third transformer is connected to an N-th power amplifier, and the N-th power amplifier is connected to a first transformer in series, wherein a first path is branched from a junction between the N-th power amplifier and the third transformer is connected to a first phase compensation portion in which a first phase delay device and a second transformer are connected in series, and an output port of the first phase compensation portion is connected to a junction between the N-th power amplifier and the first transformer, wherein a second path branched from a junction between the (N−1)th power amplifier and the (2(N−1)−1)th transformer is connected to a second phase compensation portion in which a second phase delay device and a fourth transformer are connected in series, and an output port of the second phase compensation portion is connected to a junction between the (N−1)th power amplifier and the third transformer, wherein a third path branched from a junction between the first power amplifier and the second power amplifier is connected to the (N−1)th phase compensation portion in which an (N−1)th phase delay device and a (2(N−1))th transformer are connected in series, and an output port of the (N−1)th phase compensation portion is connected to a junction between the second power amplifier and the (2(N−1)−1)th transformer, and wherein a total efficiency is determined by the number of stages of the power amplifier, that is, N.

The series type Doherty amplifier further comprises a control portion applying an external bias to each of the N units of the power amplifiers according to an output power level.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
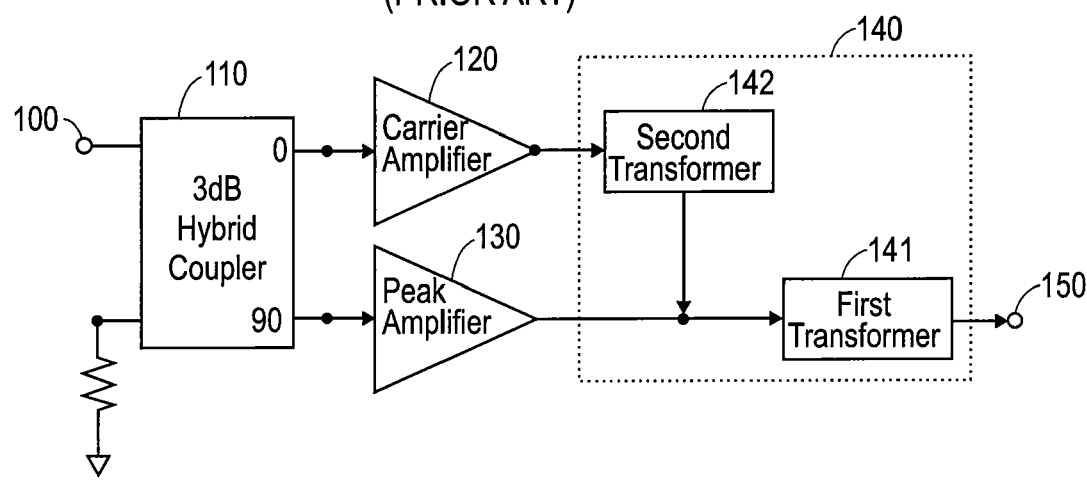
FIG. 1 is a block diagram of a conventional Doherty amplifier.
Figure 2:
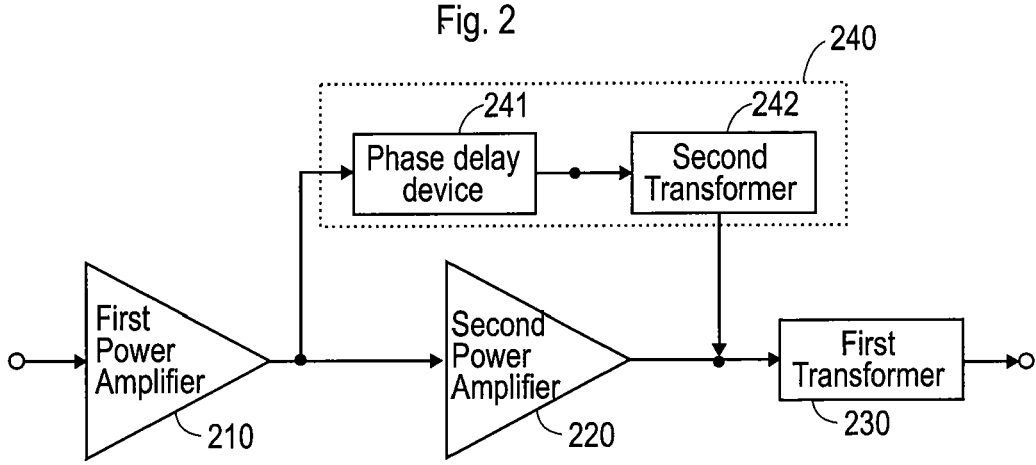
FIG. 2 is a block diagram of a Doherty amplifier having power amplifiers connected in series according to an embodiment of the present invention.

FIG. 2 is a block diagram of a Doherty amplifier having power amplifiers connected in series according to an embodiment of the present invention. Referring to FIG. 2, the Doherty amplifier includes a first power amplifier 210, a second power amplifier 220, a first transformer 230, and a phase compensation portion 240.

In the Doherty amplifier, the first power amplifier 210, the second power amplifier 220, and the first transformer 230 are connected in series. A signal branched from a junction 261 between the first power amplifier 210 and the second power amplifier 220 is input to the phase compensation portion 240. An output port of the phase compensation portion 240 is connected to a junction 262 between the second power amplifier 220 and the first transformer 230.

The first power amplifier 210 functions as a carrier amplifier and includes both of an input/output matching circuit and a bias circuit. The first power amplifier 210 does not need to be a 1-stage.

The second power amplifier 220 functions as a peak amplifier with the first power amplifier 210 and includes both of the input/output matching circuit and the bias circuit. The second power amplifier 220 does not need to be a 1-stage like the first power amplifier 210.

The phase compensation portion 240 is a circuit having a phase delay device 241 and a second transformer 242 connected in series. The phase compensation portion 240 can be embodied using a pass device L or C, a micro-strip, and an active device, or by a simple equivalent circuit.

Figure 3:
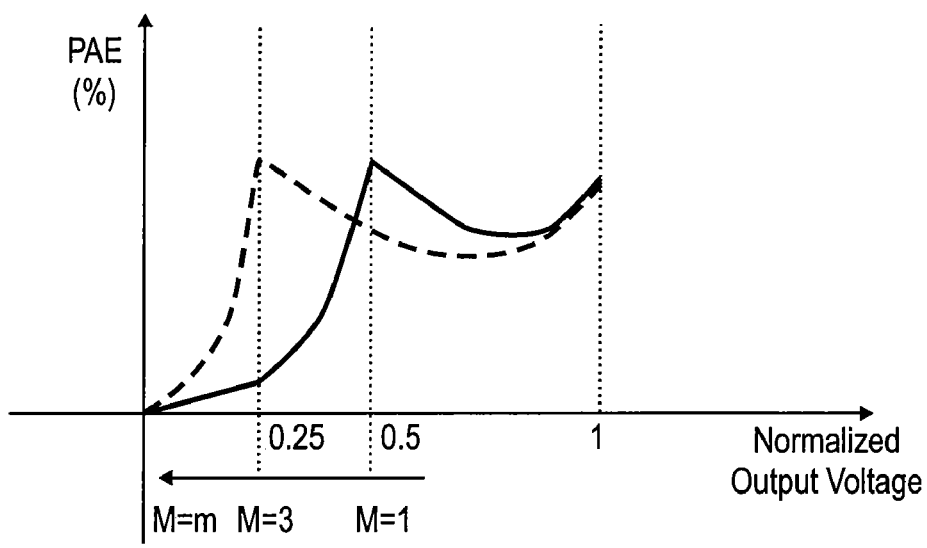
FIG. 3 is a graph for showing an efficiency of a power amplifier according to an output voltage.

Also, a power efficiency (%) can vary according to a ratio between the respective last stages of the first power amplifier 210 and the second power amplifier 220, FIG. 3 is a graph for showing an efficiency of a power amplifier according to an output voltage. Referring to FIG. 3, an efficiency of a power amplifier according to a ratio of 1:M in the size of the respective last stages of the first power amplifier 210 and the second power amplifier 220 is shown. As the ratio increases, that is, M increases, a high power efficiency at a low output voltage can be maintained.

Figure 4:
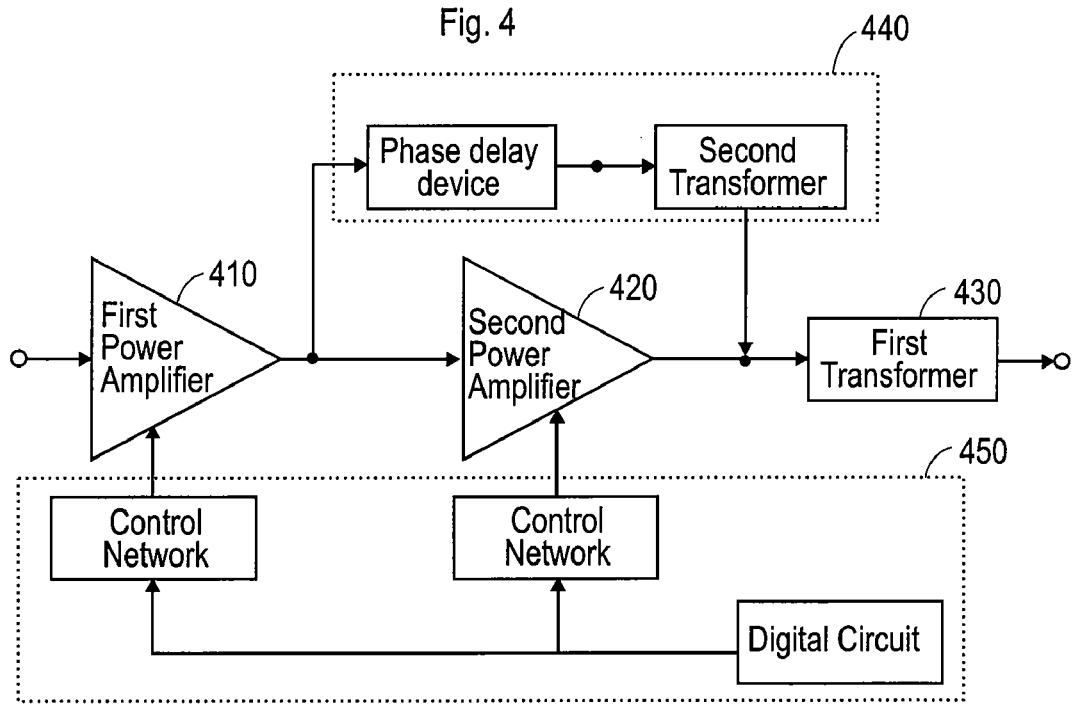
FIG. 4 is a block diagram of a Doherty amplifier having power amplifiers connected in series according to another embodiment of the present invention.

FIG. 4 is a block diagram of a Doherty amplifier having power amplifiers connected in series according to another embodiment of the present invention. Referring to FIG. 4, the Doherty amplifier includes a first power amplifier 410, a second power amplifier 420, a first transformer 430, a phase compensation portion 440, and a control portion 450.

The Doherty amplifier of FIG. 4 has a structure in which the control portion 450 is added to the structure of the Doherty amplifier of FIG. 2. The control portion 450 controls biases of the first power amplifier 410 and the second power amplifier 420 according to the level of an output power.

For example, for a power level having a low output voltage level, the control portion 450 controls the biases of the first power amplifier 410 and the second power amplifier 420 such that the first power amplifier 410 functions as a B-class amplifier or an AB-class amplifier while the second power amplifier 420 is turned off or functions as a C-class amplifier or the B-class amplifier.

For a power level having a high output voltage level, the control portion 450 controls the biases of the first power amplifier 410 and the second power amplifier 420 such that the first power amplifier 410 functions as the B-class amplifier or the AB-class amplifier while the second power amplifier 420 functions as the B-class amplifier or the AB-class amplifier.

Figure 5:
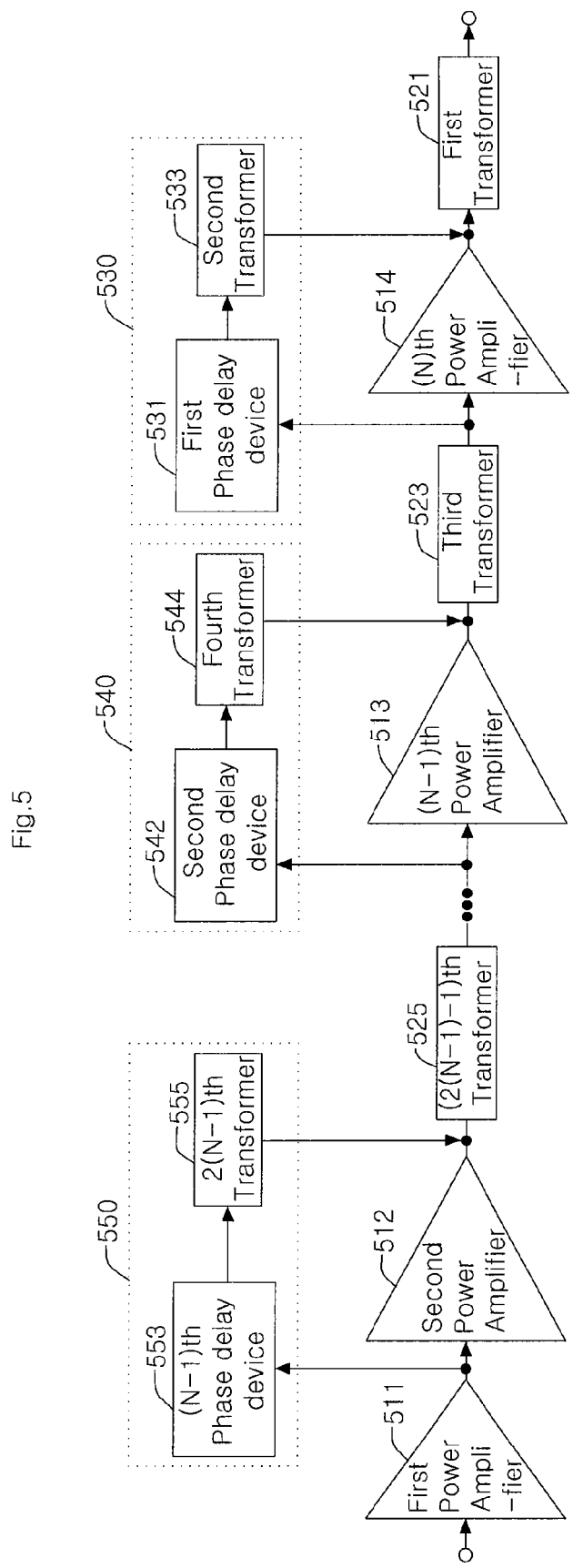
FIG. 5 is a block diagram of a Doherty amplifier having power amplifiers connected in series according to yet another embodiment of the present invention.

FIG. 5 is a block diagram of a Doherty amplifier having power amplifiers connected in series according to yet another embodiment of the present invention. Referring to FIG. 5, the Doherty amplifier includes a first power amplifier 511, a second power amplifier 512 through an (N−1)th power amplifier 513, an N-th power amplifier 514, a first transformer 521, a third transformer 523, a (2(N−1)−1)th transformer 525, a first phase compensation portion 530, a second phase compensation portion 540, and an (N−1)th phase compensation portion 550.

In the Doherty amplifier of FIG. 5, the first power amplifier 511 and the second power amplifier 512 are connected in series. An output port of the second power amplifier 512 is connected to the (2(N−1)−1)th transformer 525 in series. An output port of the (N−1)th power amplifier 513 is connected to the third transformer 523 in series. An output port of the third transformer 523 is connected to the N-th power amplifier 514. The N-th power amplifier 514 is connected to the first transformer 521 in series.

Also, a first path branched from a junction between the N-th power amplifier 514 and the third transformer 523 is connected to the first phase compensation portion 530 in which a first phase delay device 531 and a second transformer 533 are connected in series. An output port of the first phase compensation portion 530 is connected to a junction between the N-th power amplifier 514 and the first transformer 521. A second path branched from a junction between the (N−1)th power amplifier 513 and the (2(N−1)−1)th transformer 525 is connected to the second phase compensation portion 540 in which a second phase delay device 542 and a fourth transformer 544 are connected in series. An output port of the second phase compensation portion 540 is connected to a junction between the (N−1)th power amplifier 513 and the third transformer 523. A third path branched from a junction between the first power amplifier 511 and the second power amplifier 512 is connected to the (N−1)th phase compensation portion 550 in which an (N−1)th phase delay device 553 and a (2(N−1))th transformer 555 are connected in series. An output port of the (N−1)th phase compensation portion 550 is connected to a junction between the second power amplifier 512 and the (2(N−1)−1)th transformer 525. Here, 2(N−1) number of transformers are needed for each power amplifier and no transformer exists at the first stage.

The first power amplifier 511 through the (N−1)th power amplifier 513 function as a carrier amplifier, include both of an input/output matching circuit and a bias circuit, and does not need to be a 1-stage.

The N-th power amplifier 514 functions as a peak amplifier with the first power amplifier 511 through the (N−1)th power amplifier 513, includes both of the the input/output matching circuit and the bias circuit, and does not need to be a 1-stage like the first power amplifier 210 like the first power amplifier 511 through the (N−1)th power amplifier 513.

The first phase compensation portion 530 is a circuit having the first phase delay device 531 and the second transformer 533 connected in series. The first phase compensation portion 530 can be embodied using a pass device L or C, a micro-strip, and an active device, or by a simple equivalent circuit.

The second phase compensation portion 540 is a circuit having the second phase delay device 542 and the fourth transformer 544 connected in series. The second phase compensation portion 540 can be embodied using a pass device L or C, a micro-strip, and an active device, or by a simple equivalent circuit.

The (N−1)th phase compensation portion 550 is a circuit having the (N−1)th phase delay device 553 and the (2(N−1))th transformer 555 connected in series. The (N−1)th phase compensation portion 550 can be embodied using a pass device L or C, a micro-strip, and an active device, or by a simple equivalent circuit.

In the power amplifier, a total efficiency is characteristically determined by the number of stages of the power amplifier, that is, N.

Figure 6:
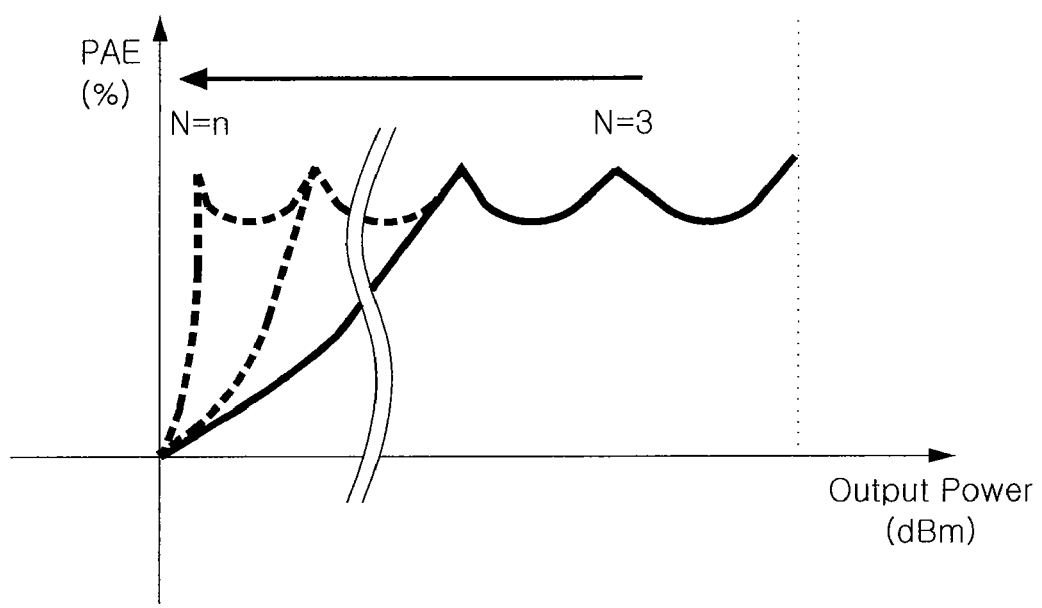
FIG. 6 is a graph for showing an efficiency of a power amplifier according to an output voltage in a Doherty amplifier in which N units of power amplifiers are connected in series.

FIG. 6 is a graph for showing an efficiency of a power amplifier according to an output voltage in a Doherty amplifier in which N units of power amplifiers are connected in series. The graph of FIG. 6 shows an efficiency of the power amplifier according to the number of stages of the power amplifier, that is, the N, in the power amplifier. It can be seen that the N times of the maximum efficiency can be maintained in the total output power by depending on the N.

Figure 7:
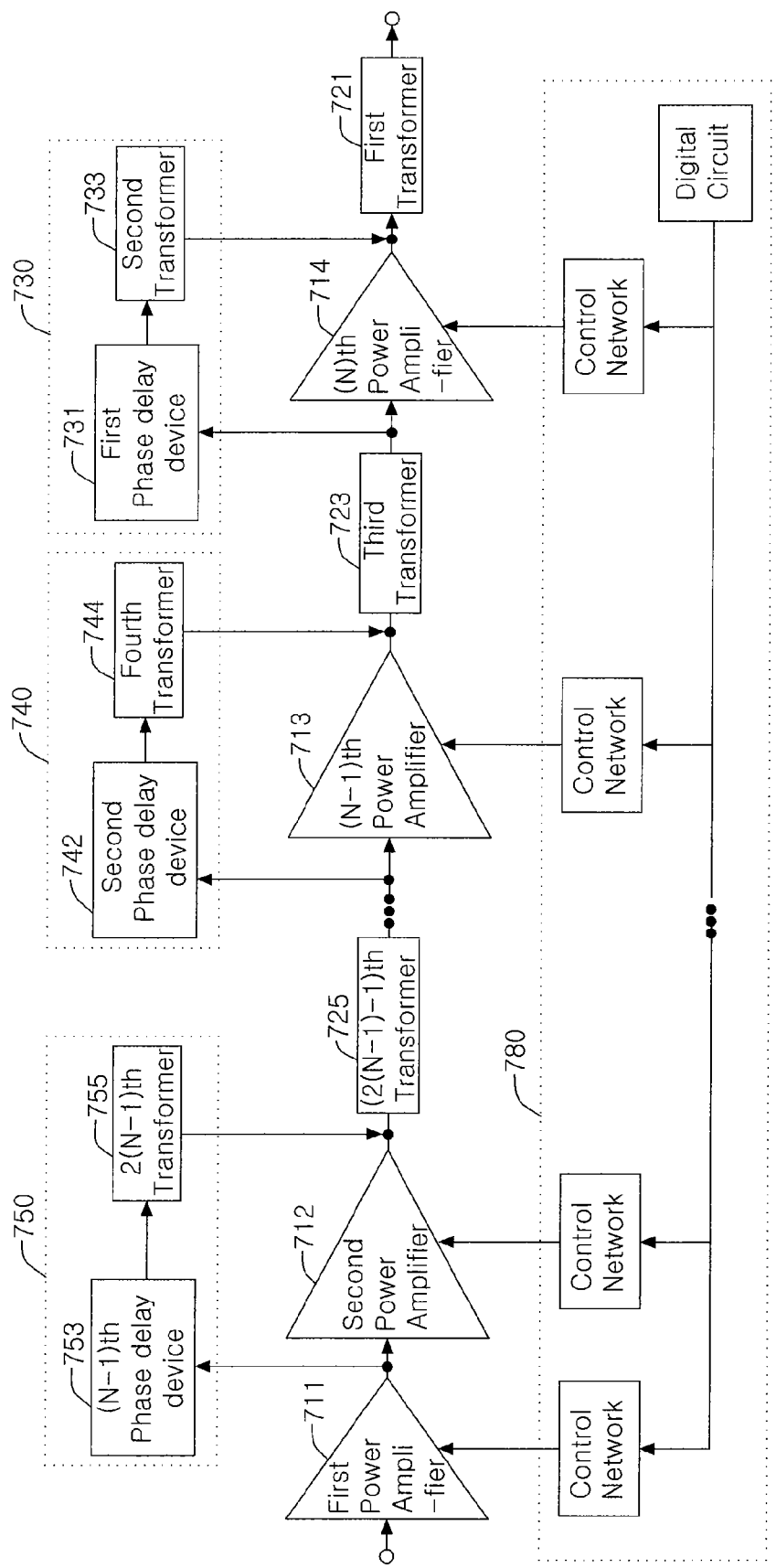
FIG. 7 is a block diagram of a Doherty amplifier having power amplifiers connected in series according to yet further another embodiment of the present invention.

FIG. 7 is a block diagram of a Doherty amplifier having power amplifiers connected in series according to yet further another embodiment of the present invention. Referring to FIG. 7, the Doherty amplifier includes a first power amplifier 711, a second power amplifier 712 through an (N−1)th power amplifier 713, an N-th power amplifier 714, a first transformer 721, a third transformer 723, a (2(N−1)−1)th transformer 725, a first phase compensation portion 730, a second phase compensation portion 740, an (N−1)th phase compensation portion 750, and a control portion 780. First phase compensation portion 730 includes a first phase delay device 731 and second transformer 733, second phase compensation portion 740 includes a second phase delay device 742 and fourth transformer 744, and (N−1)th phase compensation portion 750 includes (N−1)th phase delay device 753 and 2(N−1)th transformer 755.

The Doherty amplifier of FIG. 7 has a structure in which the control portion 780 is added to the structure of the Doherty amplifier of FIG. 5. The control portion 780 controls biases of the N units of power amplifiers by applying an external bias to each of the N units of power amplifiers according to the level of an output power.

That is, the control portion 780 controls the biases of the N units of the power amplifiers such that the N units of the power amplifiers are turned off or function as a B-class amplifier, an AB-class amplifier, or a C-class amplifier according to the output voltage level.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, since a plurality of power amplifiers are connected in series without a hybrid coupler, integration thereof using a small sized pass device is easy and a power efficiency of the amplifier can be improved. Also, a Doherty amplifier function can be simply embodied by adding a path to the structure of a general amplifier.

The embodiments of the present invention have been described above for purposes of illustrating the present invention. It is not intended to be exhaustive or to limit the invention to the precise form described. Many modifications and variations are possible in light of the teaching above. Accordingly, the scope of the invention is defined by the appended claims.

What is claimed is:

1. A series type Doherty amplifier comprising a first power amplifier and a second power amplifier using a plurality of transformers, wherein the first power amplifier and the second power amplifier are connected in series, the second power amplifier and a first transformer are connected in series, a first path is branched from a junction between the first power amplifier and the second power amplifier and a phase delay device and a second transformer are connected in series, an output port of the second transformer is connected to a junction of a second path of an output port of the second power amplifier, and an efficiency of each power amplifier is determined by a ratio of 1:M in size of a final stage of each of the first and second power amplifiers.

2. The series type Doherty amplifier of claim 1, further comprising a control portion applying an external bias to each of the first and second power amplifiers according to an output power level.

3. The series type Doherty amplifier of claim 1, wherein the phase delay device, the first transformer, and the second transformer are embodied with a passive device L or C, a micro-strip, and an active device.

4. The series type Doherty amplifier of claim 2, wherein the phase delay device, the first transformer, and the second transformer are embodied with a passive device L or C, a micro-strip, and an active device.

5. The series type Doherty amplifier of claim 3, wherein the phase delay device and the second transformer are embodied with an equivalent circuit.

6. The series type Doherty amplifier of claim 4, wherein the phase delay device and the second transformer are embodied with an equivalent circuit.

7. The series type Doherty amplifier of claim 1, wherein the first power amplifier and the second power amplifier comprise an input/output matching circuit and a bias circuit.

8. The series type Doherty amplifier of claim 3, wherein the first power amplifier and the second power amplifier comprise an input/output matching circuit and a bias circuit.

9. The series type Doherty amplifier of claim 4, wherein the first power amplifier and the second power amplifier comprise an input/output matching circuit and a bias circuit.

10. The series type Doherty amplifier of claim 7, wherein each of the first power amplifier and the second power amplifier is formed of at least one stage.

11. The series type Doherty amplifier of claim 8, wherein each of the first power amplifier and the second power amplifier is formed of at least one stage.

12. The series type Doherty amplifier of claim 9, wherein each of the first power amplifier and the second power amplifier is formed of at least one stage.

13. The series type Doherty amplifier of claim 10, wherein a high efficiency is maintained at a low output power as the ratio in size of the final stage of each of the first power amplifier and the second power amplifier.

14. The series type Doherty amplifier of claim 11, wherein a high efficiency is maintained at a low output power as the ratio in size of the final stage of each of the first power amplifier and the second power amplifier.

15. The series type Doherty amplifier of claim 12, wherein a high efficiency is maintained at a low output power as the ratio in size of the final stage of each of the first power amplifier and the second power amplifier.

16. A series type Doherty amplifier comprising N units of power amplifiers which are connected in series using a plurality of transformers, wherein a first power amplifier and a second power amplifier are connected in series, an output port of the second power amplifier is connected to a (2(N−1)−1)th transformer in series, an output port of an (N−1)th power amplifier is connected to a third transformer in series, an output port of a third transformer is connected to an N-th power amplifier, and the N-th power amplifier is connected to a first transformer in series, wherein a first path is branched from a junction between the N-th power amplifier and the third transformer is connected to a first phase compensation portion in which a first phase delay device and a second transformer are connected in series, and an output port of the first phase compensation portion is connected to a junction between the N-th power amplifier and the first transformer, wherein a second path branched from a junction between the (N−1)th power amplifier and the (2(N−1)−1)th transformer is connected to a second phase compensation portion in which a second phase delay device and a fourth transformer are connected in series, and an output port of the second phase compensation portion is connected to a junction between the (N−1)th power amplifier and the third transformer, wherein a third path branched from a junction between the first power amplifier and the second power amplifier is connected to the (N−1)th phase compensation portion in which an (N−1)th phase delay device and a (2(N−1))th transformer are connected in series, and an output port of the (N−1)th phase compensation portion is connected to a junction between the second power amplifier and the (2(N−1)−1)th transformer, and wherein a total efficiency is determined by the number of stages of the power amplifier, that is, N.

17. The series type Doherty amplifier of claim 16, further comprising a control portion applying an external bias to each of the N units of the power amplifiers according to an output power level.

18. The series type Doherty amplifier of claim 16, wherein the first phase delay device, the second phase delay device, the (N−1)th phase delay device, the first transformer, the second transformer, the third transformer, the fourth transformer, the (2(N−1)−1)th transformer, and the 2(N−1)th transformer are embodied with a passive device L or C, a micro-strip, and an active device.

19. The series type Doherty amplifier of claim 17, wherein the first phase delay device, the second phase delay device, the (N−1)th phase delay device, the first transformer, the second transformer, the third transformer, the fourth transformer, the (2(N−1)−1)th transformer, and the 2(N−1)th transformer are embodied with a passive device L or C, a micro-strip, and an active device.

20. The series type Doherty amplifier of claim 18, wherein the first phase delay device and the second transformer are embodied with an equivalent circuit.

21. The series type Doherty amplifier of claim 19, wherein the first phase delay device and the second transformer are embodied with an equivalent circuit.

22. The series type Doherty amplifier of claim 18, wherein the second phase delay device and the fourth transformer are embodied with an equivalent circuit.

23. The series type Doherty amplifier of claim 19, wherein the second phase delay device and the fourth transformer are embodied with an equivalent circuit.

24. The series type Doherty amplifier of claim 18, wherein the (N−1)th phase delay device and the 2(N−1)th transformer are embodied with an equivalent circuit.

25. The series type Doherty amplifier of claim 19, wherein the (N−1)th phase delay device and the 2(N−1)th transformer are embodied with an equivalent circuit.

26. The series type Doherty amplifier of claim 16, wherein the first through N-th power amplifiers comprise an input/output matching circuit and a bias circuit.

27. The series type Doherty amplifier of claim 17, wherein the first through N-th power amplifiers comprise an input/output matching circuit and a bias circuit.

28. The series type Doherty amplifier of claim 26, wherein each of the first through N-th power amplifiers is formed of at least one stage.

29. The series type Doherty amplifier of claim 27, wherein each of the first through N-th power amplifiers is formed of at least one stage.

30. The series type Doherty amplifier of claim 16, wherein an N times high efficiency is maintained in a total output power by depending on the number of stages of the power amplifier, that is, N.

31. The series type Doherty amplifier of claim 17, wherein an N times high efficiency is maintained in a total output power by depending on the number of stages of the power amplifier, that is, N.

* * * * *